United States Patent
Yoshida (10) Patent No.: US 10,847,733 B2
(45) Date of Patent: Nov. 24, 2020

(54) DISPLAY DEVICE

(71) Applicant: Sharp Kabushiki Kaisha, Sakai (JP)

(72) Inventor: Tokuo Yoshida, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/467,511

(22) PCT Filed: Aug. 4, 2017

(86) PCT No.: PCT/JP2017/028400
§ 371 (c)(1),
(2) Date: Jun. 7, 2019

(87) PCT Pub. No.: WO2019/026280
PCT Pub. Date: Feb. 7, 2019

(65) Prior Publication Data
US 2019/0372035 A1 Dec. 5, 2019

(51) Int. Cl.
*H01L 51/00* (2006.01)
*H01L 27/32* (2006.01)
*H01L 21/02* (2006.01)
*B32B 7/04* (2019.01)

(52) U.S. Cl.
CPC ........... *H01L 51/0097* (2013.01); *B32B 7/04* (2013.01); *H01L 21/02428* (2013.01); *H01L 21/02433* (2013.01); *H01L 27/3276* (2013.01); *H01L 2251/5338* (2013.01)

(58) Field of Classification Search
CPC ......... H01L 51/0097; H01L 2251/5338; H01L 21/02428; H01L 21/02433; H01L 27/3276; B32B 7/04
See application file for complete search history.

(56) References Cited

U.S. PATENT DOCUMENTS

| | | | |
|---|---|---|---|
| 2013/0202871 A1 | 8/2013 | Hidaka et al. | |
| 2013/0207114 A1* | 8/2013 | Suzuki | G02F 1/136286 257/59 |
| 2017/0288009 A1* | 10/2017 | Kim | H01L 27/3279 |
| 2017/0317299 A1* | 11/2017 | Choi | H01L 51/5253 |
| 2017/0365653 A1* | 12/2017 | Kim | G02F 1/13458 |
| 2018/0165996 A1 | 6/2018 | Ochi et al. | |
| 2019/0012031 A1* | 1/2019 | Kim | H01L 51/5237 |
| 2019/0019441 A1* | 1/2019 | Shin | G09G 3/3233 |
| 2019/0355800 A1* | 11/2019 | Saitoh | H05B 33/22 |
| 2020/0066821 A1* | 2/2020 | Saitoh | H05B 33/10 |

(Continued)

FOREIGN PATENT DOCUMENTS

| | | |
|---|---|---|
| JP | 04-341838 A | 11/1992 |
| JP | 11-295527 A | 10/1999 |

(Continued)

OTHER PUBLICATIONS

Official Communication issued in International Patent Application No. PCT/JP2017/028400, dated Oct. 24, 2017.

*Primary Examiner* — Joseph C. Nicely
(74) *Attorney, Agent, or Firm* — Keating & Bennett, LLP (57) ABSTRACT

Reliability of a resin substrate is further enhanced. A first resin layer is made of polymer resin having a long-axis direction. A second resin layer is made of polymer resin having a long-axis direction slanted with respect to the long-axis direction in a plan view.

6 Claims, 7 Drawing Sheets

(56) References Cited

U.S. PATENT DOCUMENTS

2020/0066822 A1* 2/2020 Saitoh .................. G09F 9/30
2020/0103691 A1* 4/2020 Ohashi ............... G02F 1/13452

FOREIGN PATENT DOCUMENTS

| JP | 2006-130855 | A |   | 5/2006 |
|----|-------------|---|---|--------|
| JP | 2011-207167 |   | * | 10/2011 |
| JP | 2011-207167 | A |   | 10/2011 |
| JP | 2013-158984 | A |   | 8/2013 |
| JP | 2016-132103 | A |   | 7/2016 |
| JP | 2017-009646 | A |   | 1/2017 |
| WO | 2016/204121 | A1 |  | 12/2016 |

* cited by examiner

DISPLAY DEVICE

TECHNICAL FIELD

The disclosure relates to a resin substrate and a display device.

BACKGROUND ART

PTL 1 discloses a layered body for a substrate, the layered body including a glass base material, a first polyimide layer layered on the glass base material, the first polyimide layer being made of polyimide (A) having a mean coefficient of linear thermal expansion ranging from 0 to 30 ppm/K at a temperature ranging from 50° C. to 200° C.; a second polyimide layer layered on at least a part of the surface of the first polyimide layer, the second polymide layer being made of polyimide (B) having a mean coefficient of linear thermal expansion ranging from 40 to 100 ppm/K at a temperature ranging from 50° C. to 200° C.

PTL 2 discloses a flexible gas barrier member including a plate glass having a thickness ranging from 10 μm to 100 μm, a first resin layer formed on at least one surface of the plate glass, the first resin layer having a Young's modulus equal to or less than 10 MPa, and a second resin layer formed on the first resin layer, the second resin layer having a Young's modulus equal to or more than 100 MPa.

CITATION LIST

Patent Literature

PTL 1: JP 2016-132103A
PTL 2: JP 2006-130855A

SUMMARY

Technical Problem

The configuration of PTL 1 has a problem in which the layered body for a substrate has a low reliability due to the occurrence of a crack. The configuration of PTL 2 also has a similar problem.

The disclosure has been made to solve the problem described above, and an object of the disclosure is to further enhance the reliability of a resin substrate.

Solution to Problem

In order to solve the problem described above, a resin substrate according to one aspect of the disclosure includes a first resin layer made of a first polymer resin having a first long-axis direction, an intermediate layer formed on the first resin layer, and a second resin layer made of a second polymer resin having a second long-axis direction slanted with respect to the first long-axis direction in a plan view, the second resin layer being formed on the intermediate layer.

Advantageous Effects of Disclosure

One aspect of the disclosure provides an effect to further enhance the reliability of a resin substrate.

DESCRIPTION OF EMBODIMENTS

Configuration of Resin Substrate 1

Figure 1:
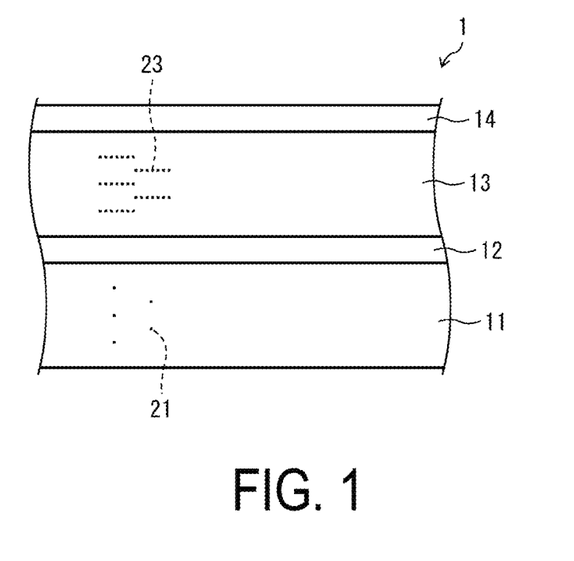
FIG. 1 is a cross-sectional view illustrating a cross section of a resin substrate.
Figure 2:
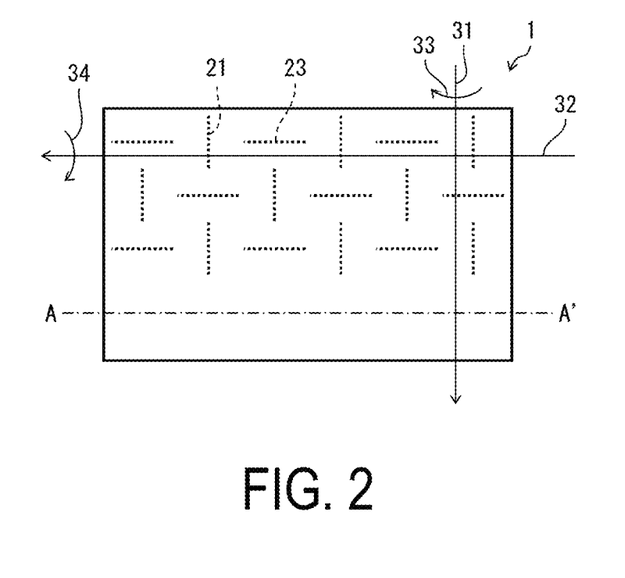
FIG. 2 is a diagram illustrating a planar configuration of a resin substrate.

FIG. 1 is a cross-sectional view illustrating a cross section of a resin substrate 1. FIG. 2 is a diagram illustrating a planar configuration of the resin substrate 1. FIG. 1 illustrates a cross section A-A' of the resin substrate 1 of FIG. 2.

The resin substrate 1 is a substrate made of resin, the substrate being used in various types of display devices such as an organic EL display device. As illustrated in FIG. 1, the resin substrate 1 includes a first resin layer 11, an intermediate layer 12, a second resin layer 13, and a base coat 14, which are arranged in this order from the bottom side.

The first resin layer 11 is made of polymer resin (first polymer resin) such as polyimide, epoxy, and polyamide. The intermediate layer 12 is an inorganic film made of an inorganic material such as $SiO_2$ (silicon dioxide). The second resin layer 13 is made of polymer resin (second polymer resin) such as polyimide, epoxy, and polyamide. In one example, both the material of the first resin layer 11 and the material of the second resin layer 13 are polyimide. The first resin layer 11 and the second resin layer 13 each have a thickness ranging from approximately several μm to 20 μm. The entire thickness of the resin substrate 1 approximately ranges from 10 um to 20 um.

The polymer resin of the first resin layer 11 has a long-axis direction 21 (first long-axis direction). The polymer resin of the second resin layer 13 has a long-axis direction 23 (second long-axis direction) slanted with respect to the long-axis direction 21 in a plan view of the resin substrate 1. In FIG. 1, the long-axis direction 21 of the polymer resin in the first resin layer 11 is parallel to the short-side direction 31 of the resin substrate 1. On the other hand, the long-axis direction 23 of the polymer resin in the second resin layer 13 is parallel to a long-side direction 32 of the resin substrate 1. In other words, the long-axis direction 21 and the long-axis direction 23 are perpendicular to each other.

The resin substrate 1 has a dual-layer structure including the first resin layer 11 and the second resin layer 13. This configuration makes the resin substrate 1 flexible as a whole.
Advantage of Resin Substrate 1

It is assumed that the display device, which includes the resin substrate 1, is warped in a warping direction 33 parallel to the long-side direction 32 of the resin substrate 1 with the short-side direction 31 of the resin substrate 1 being an axis. In this case, a force that causes a crack parallel to the short-side direction 31 of the resin substrate 1 may act on the resin substrate 1. However, since the long-axis direction 23 of the polymer resin in the second resin layer 13 is perpendicular to the short-side direction 31 of the display device, a crack is less likely to occur in the second resin layer 13. Thus, even if a crack extending along the short-side direction 31 occurs in the first resin layer 11 due to this warping, this crack is prevented from having a depth to the extent that the crack penetrates through the resin substrate 1. For this reason, the water proof property of the resin substrate 1 is maintained, thus making it possible to enhance the reliability of the resin substrate 1.

It is assumed that the display device, which includes the resin substrate 1, is warped in a warping direction 34 parallel to the short-side direction 31 of the resin substrate 1 with the long-side direction 32 of the resin substrate 1 being an axis. In this case, a force that causes a crack parallel to the long-side direction 32 of the resin substrate 1 may act on the resin substrate 1. However, since the long-axis direction 21 of the polymer resin in the first resin layer 11 is perpendicular to the long-side direction 32 of the resin substrate 1, a crack is less likely to occur in the first resin layer 11. Even if this warping causes a crack extending along the long-side direction 32 to occur in the second resin layer 13, this crack is prevented from having a depth to the extent that the crack penetrates through the resin substrate 1. Thus, the water proof property of the resin substrate 1 is maintained, which makes it possible to enhance the reliability of the resin substrate 1.

As described above, even if the display device including the resin substrate 1 is warped toward either the long-side direction or the short-side direction of the display device, a crack, which is deep to the extent that the reliability of the resin substrate 1 is impaired, is prevented from occurring in the resin substrate 1. A dark dot, which is caused due to the entry of moisture or water into the display portion (display region) of the display device, is prevented from occurring in the display portion, thus making it possible to further enhance the reliability of the display device including the resin substrate 1.

Method for Forming Resin Substrate 1

Figure 3A:
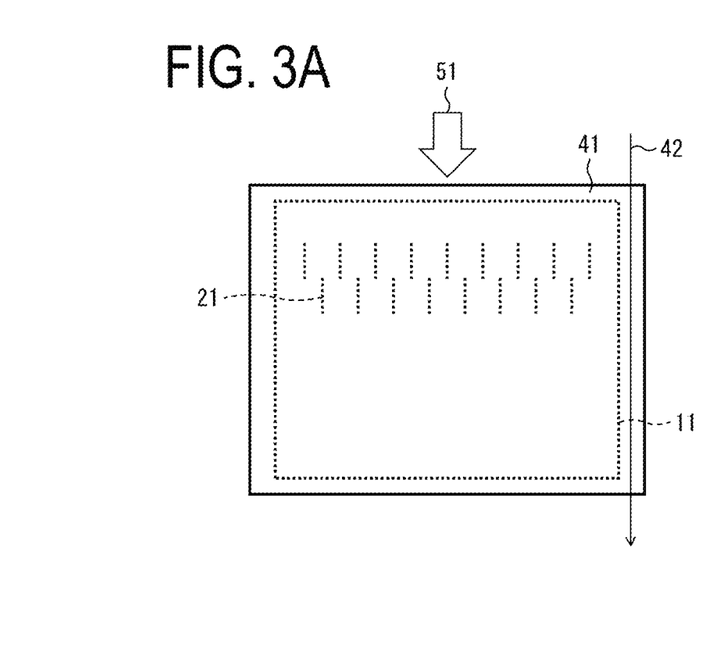
FIGS. 3A and 3B are diagrams, each describing a method for forming a resin substrate on a glass substrate.

FIGS. 3A and 3B are diagrams, each describing a method for forming the resin substrate 1 on a glass substrate 41. First, the glass substrate 41, serving as a base on which the resin substrate 1 is formed, is prepared. Next, as illustrated in FIG. 3A, polymer resin is applied on the surface of the glass substrate 41 by using a slit coater to form a first resin layer 11 on the surface of the glass substrate 41. At this time, an application direction 51 of the slit coater is set to be parallel to a short-side direction 42 of the glass substrate 41. At the time of forming the first resin layer 11, the long-axis direction 21 of the polymer resin is substantially equal to the application direction 51 of the slit coater. Thus, the long-axis direction 21 of the polymer resin of the formed first resin layer 11 is parallel to the short-side direction 42.

Figure 3B:
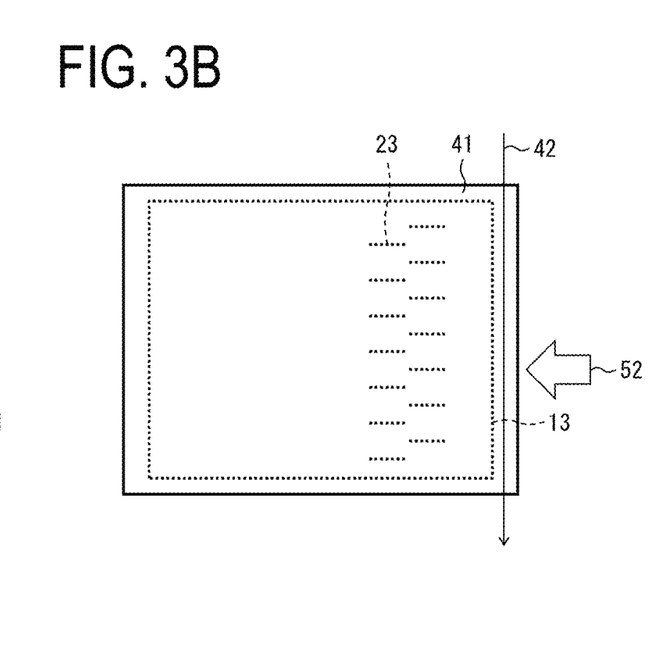

After the first resin layer 11 is formed, the intermediate layer 12 is formed on the first resin layer 11 through a given method (not illustrated). After the intermediate layer 12 is formed, polymer resin is applied on the surface of the intermediate layer 12 by using a slit coater as illustrated in FIG. 3B to form the second resin layer 13 on the surface of the intermediate layer 12. At this time, an application direction 52 of the slit coater differs from the application direction 51 of the slit coater that is set at the time of forming the first resin layer 11. In FIG. 3B, the application direction 52 is set to be perpendicular to the short-side direction 42 of the glass substrate 41. At the time of forming the second resin layer 13, the long-axis direction 23 of the polymer resin is substantially equal to the application direction 52 of the slit coater. Thus, the long-axis direction 23 of the polymer resin of the formed second resin layer 13 is perpendicular to the short-side direction 42.

After the second resin layer 13 is formed, the base coat 14 is formed on the second resin layer 13 through a given method (not illustrated). The formation of the resin substrate 1 is completed as described above. After this, various constituent elements of the display device are sequentially formed on the resin substrate 1 to manufacture the display device including the resin substrate 1.

At the time of forming the first resin layer 11, polymer resin may be applied in a manner such that the application direction 51 of the slit coater is parallel to the long-side direction of the glass substrate 41, rather than the short-side direction 42. At the time of forming the second resin layer 13, the application direction 52 of the slit coater may be set to coincide with the short-side direction 42 of the glass substrate 41.

Configuration of Display Device 2

Figure 4:
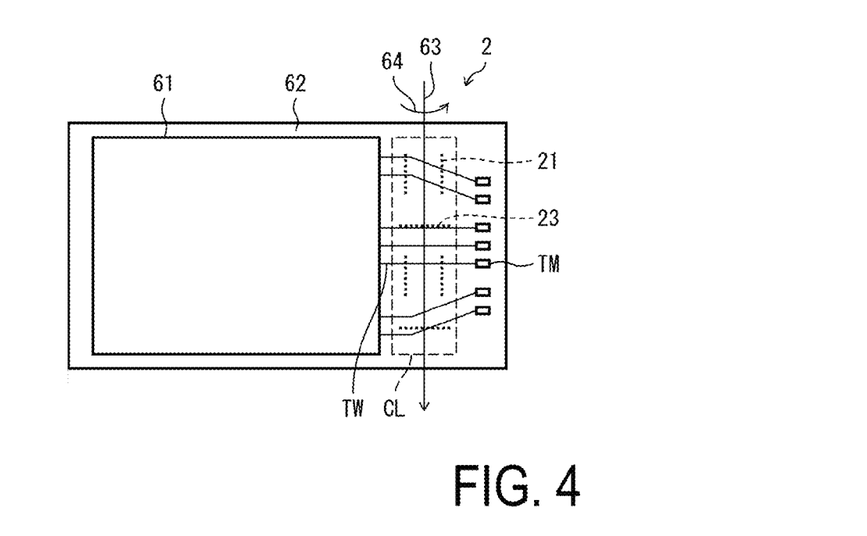
FIG. 4 is a plan view illustrating a configuration of a display device including a resin substrate.

FIG. 4 is a plan view illustrating a configuration of a display device 2 including the resin substrate 1. The display device 2 is a self-luminous display device and is configured, for example, as an organic EL light-emitting device. The display device 2 includes the resin substrate 1, a display region 61, a frame region 62, a bending portion CL, a terminal wiring line TW, and a terminal portion TM.

The display region 61 is a member that has a displaying function in the display device 2 and is composed, for example, of an organic EL light-emitting layer and the like. The frame region 62 surrounds the periphery of the display region 61. The bending portion CL, the terminal wiring line TW, and the terminal portion TM are each formed in the frame region 62. The terminal portion TM is located in an end portion of the frame region 62. The bending portion CL is provided between the display region 61 and the terminal portion TM. The terminal portion TM is used to connect the display region 61 to electronic circuit boards such as an IC chip and an FPC. The terminal wiring line TW electrically connects the display region 61 to the terminal portion TM. The bending portion CL is a portion to be bent in the display device 2.

Configuration of Display Region 61

Figure 5:
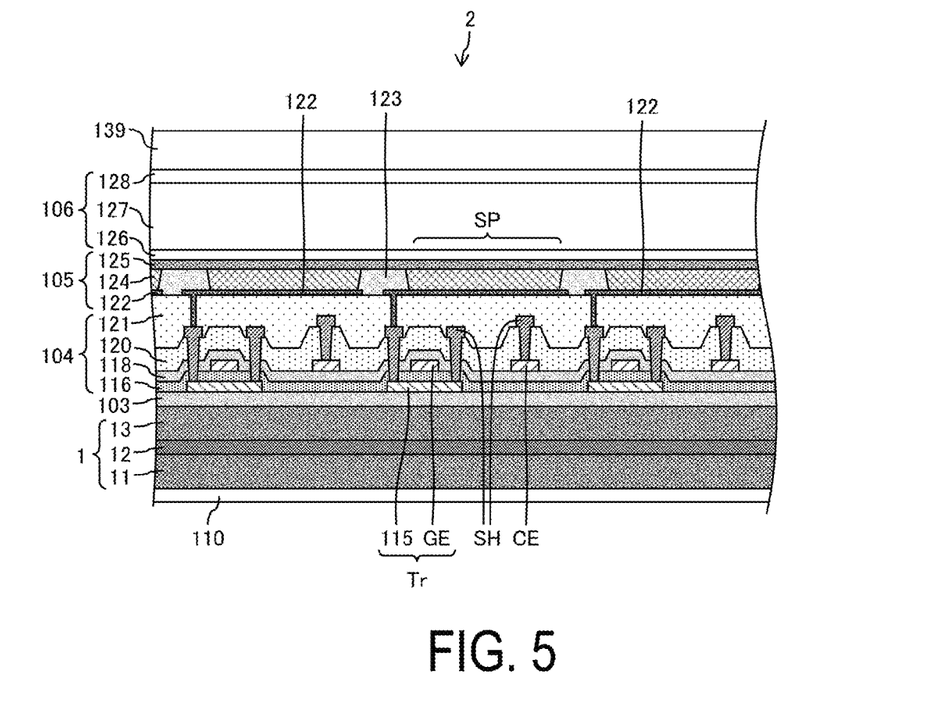
FIG. 5 is a cross-sectional view illustrating a configuration example of a display region of the display device.

FIG. 5 is a cross-sectional view illustrating a configuration example of the display region 61 of the display device 2. As illustrated in this drawing, the display device 2 includes a lower face film 110, the resin substrate 1, a barrier layer 103, a TFT layer 104, a light-emitting element layer 105, a sealing layer 106, and a function film 139.

The barrier layer 103 is a layer for preventing moisture and impurities from reaching the TFT layer 104 or the light-emitting element layer 105 in using the display device. The barrier layer 103 may be made of, for example, a silicon oxide film, silicon nitride film, or silicon oxynitride film; or a layered film thereof, all of which are formed by using CVD.

The TFT layer 104 includes a semiconductor film 115, an inorganic insulating film 116 (a gate insulating film) that is an upper layer than the semiconductor film 115, a gate electrode GE that is an upper layer than the inorganic insulating film 116, an inorganic insulating film 118 that is an upper layer than the gate electrode GE, capacity wiring CE that is an upper layer than the inorganic insulating film 118, an inorganic insulating film 120 that is an upper layer than the capacity wiring CE, source wiring SH and the terminal portion TM that are upper layers than the inorganic insulating film 120, and a flattening film 121 that is an upper layer than the source wiring SH and the terminal portion TM.

A thin film transistor Tr (TFT) is configured to include the semiconductor film 115, the inorganic insulating film 116 (the gate insulating film), and the gate electrode GE.

The semiconductor film 115 is composed, for example, of low-temperature polysilicon (LTPS) or an oxide semiconductor. Note that, in FIG. 5, the TFT, in which the semiconductor film 115 is the channel, is illustrated to have a top gate structure, but the TFT may have a bottom gate structure (in a case where the TFT channel is the oxide semiconductor, for example).

The gate electrode GE, the capacitance electrode CE, the source wiring SH, the terminal wiring line TW, and the terminal portion TM are composed, for example, of a single-layer metal film or a layered metal film including at least one of aluminum (Al), tungsten (W), molybdenum (Mo), tantalum (Ta), chromium (Cr), titanium (Ti), and copper (Cu).

The inorganic insulating films 116, 118, and 120 may be composed of a silicon oxide (SiOx) film or a silicon nitride (SiNx) film; or a layered film of these, all of which are formed, for example, by using CVD.

The flattening film (interlayer insulating film) 121 may be composed, for example, of a coatable photosensitive organic material such as a polyimide and an acrylic.

The light-emitting element layer 105 (for example, an organic light emitting diode layer) includes an anode 122 that is an upper layer than the flattening film 121, a bank 123 that covers an edge of the anode 122, an EL (electroluminescence) layer 124 that is an upper layer than the anode 122, and a cathode 125 that is an upper layer than the EL layer 124, and a plurality of light emitting elements (for example, organic light-emitting diode, OLED) including an island-shaped anode 122, the EL layer 124, and the cathode 125, and subpixel circuits that drive these are provided for each subpixel. The bank 123 (anode edge cover) may be composed, for example, of a coatable photosensitive organic material such as a polyimide and an acrylic.

The EL layer 124 is formed, for example, by layering a hole injection layer, a hole transport layer, a light-emitting layer, an electron transport layer, and an electron injecting layer in this order from the bottom side. The light-emitting layer is formed in an island shape for each subpixel through the vapor deposition or ink-jet method. The other layers may be solid-like common layers. In addition, a configuration may be possible in which one or more layers of the hole injection layer, the hole transport layer, the electron transport layer, and the electron injection layer are not formed.

An anode (anode electrode) 122 is formed by layering of indium tin oxide (ITO) and an alloy containing Ag, for example, and has a light reflectivity. The cathode 125 may be made of a transparent conductive material such as indium tin oxide (ITO), indium zinc oxide (IZO), and MgAg.

In a case where the light-emitting element layer 105 is an OLED layer, positive holes and electrons are recombined within the EL layer 124 by a drive current between the anode 122 and the cathode 125. This generates an exciton. The exciton falls into a ground state, which causes light to be emitted. Since the cathode 125 is transparent and the anode 122 has a light reflectivity, the light emitted from the EL layer 124 travels upwards and results in top-emission.

The light-emitting element layer 105 is not limited to the configuration of OLED element and may form an inorganic light emitting diode or quantum dot light emitting diode.

The sealing layer 106 is light-transmissive and includes a first inorganic sealing film 126 that covers the cathode 125, an organic sealing film 127 that is formed above the first inorganic sealing film 126, and a second inorganic sealing film 128 that covers the organic sealing film 127. The sealing layer 106 that covers the light-emitting element layer 105 prevents foreign matters such as water and oxygen from entering the light-emitting element layer 105.

The first inorganic sealing film 126 and the second inorganic sealing film 128 may be each composed of a silicon oxide film, a silicon nitride film, or a silicon oxynitride film; or a layered film of these films, all of which are formed, for example, through CVD. The organic sealing film 127 is a transparent organic film that is thicker than the first inorganic sealing film 126 and the second inorganic sealing film 128 and may be made of a coatable photosensitive organic material such as a polyimide and an acrylic.

The lower face film 110 is bonded to the lower face of the resin layer 112 after the support substrate is peeled off and is used to achieve a display device exhibiting an excellent flexibility. The material of the lower face film includes PET. The function film 139 has, for example, an optical compensation function such as a polarizing plate, a touch sensor function, a protection function, and the like.

Configuration of Bending Portion CL

Figure 6:
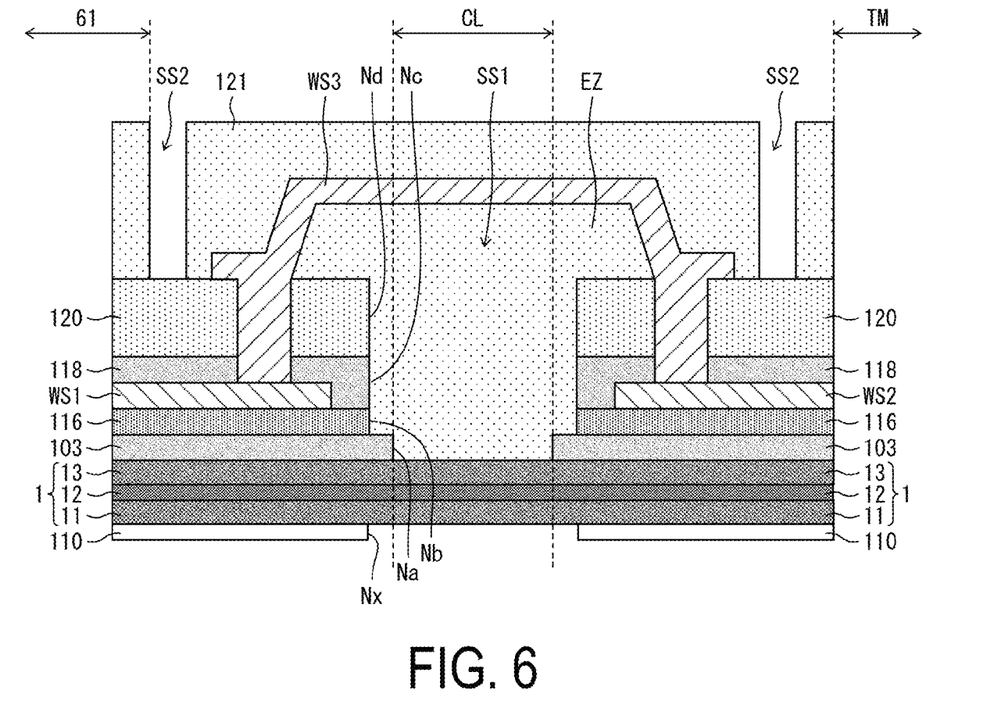
FIG. 6 is a cross-sectional view illustrating a configuration example of a bending portion CL of the display device.

FIG. 6 is a cross-sectional view illustrating a configuration example of the bending portion CL of the display device 2. The terminal portion TM is connected to the display region 61 through the terminal wiring line TW passing through the bending portion CL. A reinforcing film EZ is made of a coatable photosensitive organic material such as a polyimide and an acrylic, for example, and is formed in an upper layer than the inorganic insulating film 120 but in a lower layer than the flattening film 121. The bending portion CL of the display device 2 is bent, for example, by 180° to connect the electronic circuit board (an IC chip, a flexible printed circuit board, or the like) to the terminal portion TM provided on the lower face side.

As illustrated in FIG. 6, the bending portion CL penetrates the lower face film 110, the barrier layer 103, and the inorganic insulating films 116, 118, and 120. More specifically, a penetrating portion Nx is formed in the lower face film 110; a penetrating portion Na is formed in the barrier layer 103; a penetrating portion Nb is formed in the inorganic insulating film 116; a penetrating portion Nc is formed in the inorganic insulating film 118; and a penetrating portion Nd is formed in the inorganic insulating film 120. In a plan view of the display device 2, the penetrating portions Nx, Nb, Nc, and Nd are aligned with each other, and the penetrating portion Na aligned with the bending portion CL is located at a position inner than the penetrating portions Nx, Nb, Nc, and Nd. The reinforcing film EZ is provided in an opening SS1 caused by the penetrating portion Na and the penetrating portions Nb, Nc, and Nd.

The terminal wiring line TW includes a first wiring line WS1 and a second wiring line WS2, which are located at both sides of the bending portion CL, and also includes a third wiring line WS3 that passes through the bending portion CL and electrically connects the first wiring line WS1 and the second wiring line WS2. The first wiring line WS1 is formed in the TFT layer 104 to apply signals to a pixel circuit. The third wiring line WS3 electrically connects the first wiring line WS1 and the terminal portion TM. In the bending portion CL, the opening SS1 is provided in at least one of the inorganic insulating film 116 or the insulating film 118 that constitutes the TFT layer. The opening SS1 is filled with the reinforcing film EZ (first flattening film). The flattening film 121 (second flattening film) is formed covering the third wiring line WS3, and the third wiring line WS3 on an upper side of the opening SS1 is interposed between the flattening film 121 and the reinforcing film EZ.

In the TFT layer 104 disposed in the display region 61, pixel circuits are formed in the display region 61 in a matrix shape. A thin film transistor Tr constitutes a pixel circuit. In the TFT layer 104 disposed in the frame region 62, the terminal portion TM and the terminal wiring line TW are formed. The terminal portion TM is used for connection with a gate driver circuit, an emission circuit, and electronic circuit boards such as an IC chip and flexible printed circuit, and the terminal wiring line TW connects the terminal portion TM to wiring lines of the display region 61.

Advantage of Display Device 2

In a case of the resin substrate 1 including the bending portion CL, the bending portion CL together with the resin substrate 1 is bent as needed. In FIG. 4, the display device 2 is bent, at the bending portion CL, along a bend line parallel to the short-side direction 63 of the display device 2, and in a bending direction 64 parallel to the long-side direction of the resin substrate 1. At this time, since the long-axis direction 23 of the polymer resin in the second resin layer 13 is perpendicular to the short-side direction 63 of the display device 2, a crack is less likely to occur in the second resin layer 13. Thus, even if the bending of the display device 2 causes a crack to occur in the first resin layer 11, this crack is prevented from having a depth to the extent that the crack penetrates through the resin substrate 1. For this reason, the water proof property of the resin substrate 1 is maintained, and this makes it possible to enhance the reliability of the resin substrate 1. In addition, the entry of moisture or water into the bending portion CL is also prevented, and thus it is possible to enhance the reliability of the display device 2 including the bending portion CL.

In the vicinity of the bending portion CL, an opening SS2 is provided in the flattening film 121. Thus, the resin material of the reinforcing film EZ does not need to have the directionality of the long axis. The reinforcing film EZ is formed only within the bending portion CL, and thus the resin material for forming the reinforcing film EZ does not need to have directionality of the long axis. In summary, at the time of forming the reinforcing film EZ and the flattening film 121, the application direction (application direction for the slit coater) of polymer resin for forming these films is not limited to a specific direction. In other words, the application direction of the slit coater at the time of forming the reinforcing film EZ may be equal to the application direction 51 at the time of forming the first resin layer 11 or the application direction 52 at the time of forming the second resin layer 13. In addition, the application direction of the slit coater at the time of forming the flattening film 121 may be equal to the application direction 51 at the time of forming the first resin layer 11 or the application direction 52 at the time of forming the second resin layer 13. In other words, at least either one of the reinforcing film EZ or the flattening film 121 is made of polymer resin (third polymer resin) having a long-axis direction (third long-axis direction) that coincides with the long-axis direction 21 and is slanted with respect to the long-axis direction 23.

Such a common application direction eliminates the need for process management of the long-axis direction of polymer resin that forms the reinforcing film EZ or flattening film 121 at the time of forming the reinforcing film EZ or flattening film 121. In addition, the glass substrate 41 or slit coater does not need to be rotated at the time of forming the reinforcing film EZ or flattening film 121. Thus, it is possible to improve take time at the time of manufacturing the display device 2.

Second Embodiment

Configuration of Resin Substrate 1B

Figure 7:
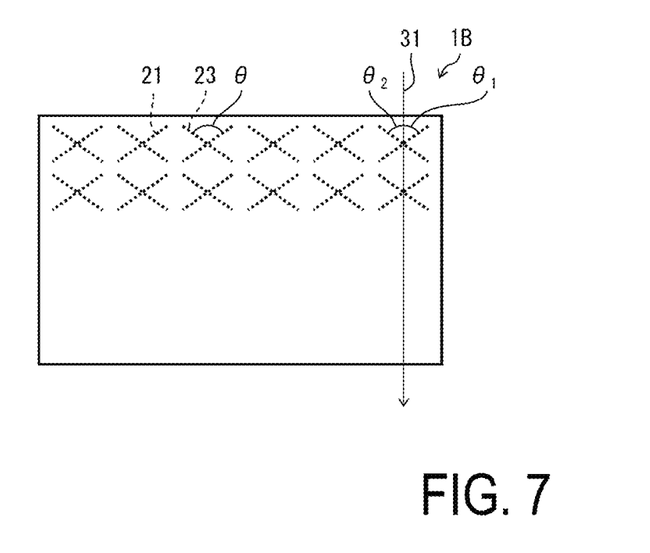
FIG. 7 is a plan view illustrating a configuration of a resin substrate.

FIG. 7 is a plan view illustrating a planar configuration of the resin substrate 1B according to a second embodiment. The constituent elements, such as the first resin layer 11, that constitute the resin substrate 1B and the arrangement thereof are basically the same as those of the resin substrate 1. However, the resin substrate 1B and the resin substrate 1 differ in that the long-axis direction 21 and the long-axis direction 23 are respectively different from the long-axis direction 21 and the long-axis direction 23 of the resin substrate 1. In the resin substrate 1B, the long-axis direction 21 and the long-axis direction 23 are slanted with respect to the direction of the same side (the long-side direction or the short-side direction) of the resin substrate 1.

In the resin substrate 1B, the angle θ formed by the long-axis direction 21 and the long-axis direction 23 satisfies a relationship of $0°<θ<90°$. In addition, the angle $θ_1$ formed by the long-axis direction 21 and the short-side direction 31 of the resin substrate 1B satisfies $0°<θ_1<45°$. The angle $θ_2$ formed by the long-axis direction 23 and the short-side direction 31 of the resin substrate 1B satisfies $-45°<θ_2<0°$.

First Method for Forming Resin Substrate 1B

Figure 8A:
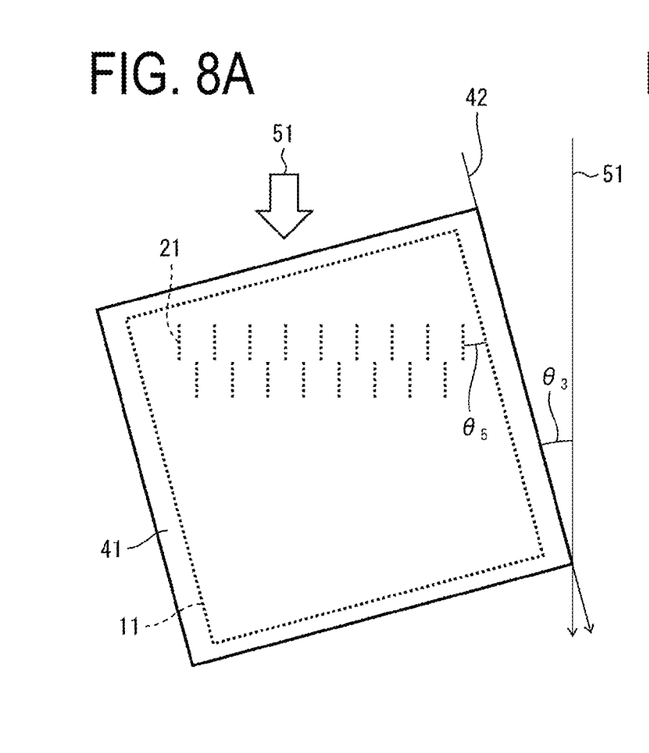
FIGS. 8A and 8B are diagrams for describing a first method for forming a resin substrate on a glass substrate.
Figure 8B:
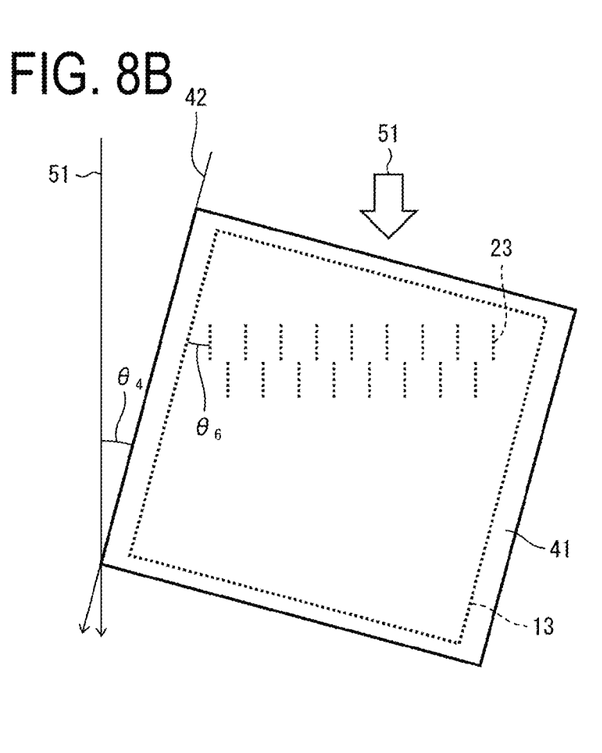

FIGS. 8A and 8B are diagrams for describing a first method for forming the resin substrate 1B on the glass substrate 41. This method employs a slit coater that can control the application width of polymer resin. According to the present embodiment, the application direction 51 of a slit coater is controlled such that the angle $θ_3$ formed by the application direction 51 of the slit coater and the short-side direction 42 of the glass substrate 41 satisfies a relationship of $-45°<θ_3<0°$ at the time of forming the first resin layer 11. For example, as illustrated in FIGS. 8A and 8B, it is only necessary to control the direction of the glass substrate 41 with respect to the application direction 51 in a manner such that the glass substrate 41 is rotated on the plane as appropriate while the application direction 51 is fixed in the same direction for both at the time of forming the first resin layer 11 and at the time of forming the second resin layer 13. At the time of applying the polymer resin, the long-axis direction 21 of polymer resin is substantially equal to the application direction 51 for the slit coater. Thus, the first resin layer 11 is formed such that the angle $θ_5$ formed by the long-axis direction 21 of polymer resin and the short-side direction 31 of the first resin layer 11 satisfies a relationship of $0°<θ_5<45°$.

According to the present embodiment, the application direction 51 of the slit coater is controlled such that the angle $θ_4$ formed by the application direction 51 of the slit coater and the short-side direction 42 of the glass substrate 41 satisfies a relationship of $0°<θ_4<45°$ at the time of forming the second resin layer 13, as illustrated in FIG. 8B. At the time of applying the polymer resin, the long-axis direction 23 of polymer resin is substantially equal to the application direction 51 of the slit coater. Thus, the second resin layer 13 is formed such that the angle $θ_6$ formed by the long-axis direction 23 of polymer resin and the short-side direction of the second resin layer 13 satisfies a relationship of $-45°<θ_6<0°$.

At the time of forming the first resin layer 11, polymer resin may be applied in a manner such that the application direction 51 of the slit coater is slanted with respect to the long side of the glass substrate 41, rather than the short-side direction 42. At the time of forming the second resin layer 13, polymer resin may be applied in a similar manner.

Second Method for Forming Resin Substrate 1B

Figure 9A:
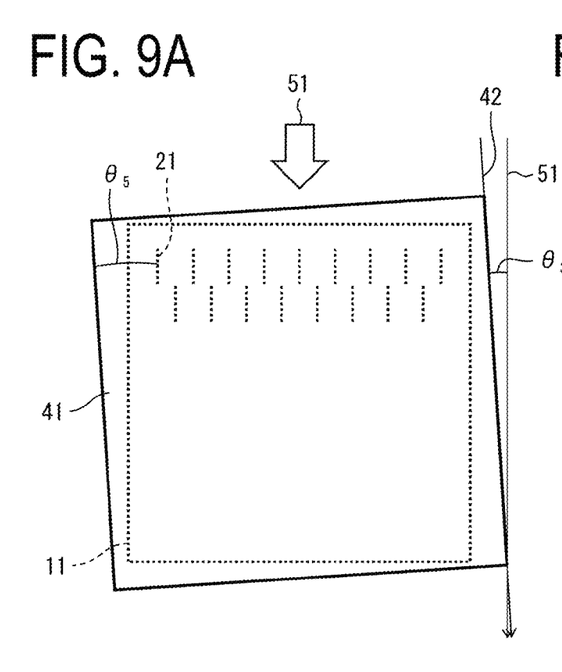
FIGS. 9A and 9B are diagrams for describing a second method for forming a resin substrate on a glass substrate.
Figure 9B:
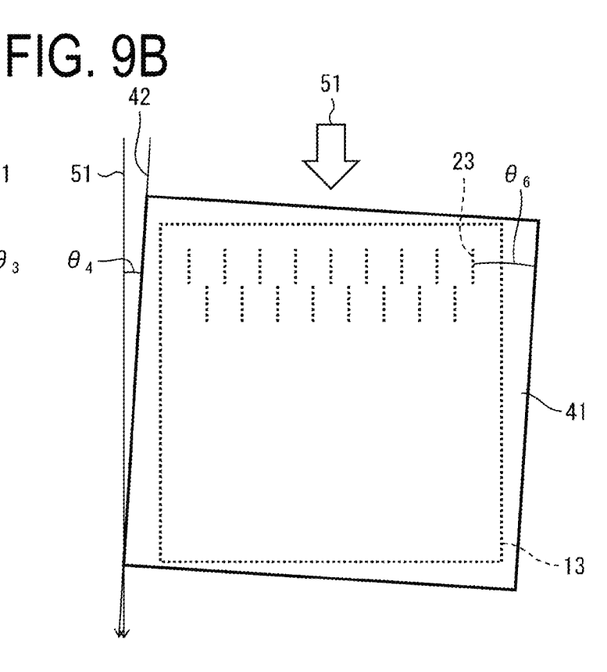

FIGS. 9A and 9B are diagrams for describing a second method for forming the resin substrate 1B on the glass substrate 41. This method employs a slit coater that cannot control the application width of polymer resin. The forming method illustrated in FIGS. 9A and 9B are the same as that illustrated in FIGS. 8A and 8B except that the type of slit coater differs, and thus detailed description will be omitted. The forming method illustrated in FIGS. 9A and 9B can be performed to form the resin substrate 1B such that the angle θ formed by the long-axis direction 21 and the long-axis direction 23 satisfies a relationship of 0°<θ<90°.

Configuration of Display Device 2B

Figure 10:
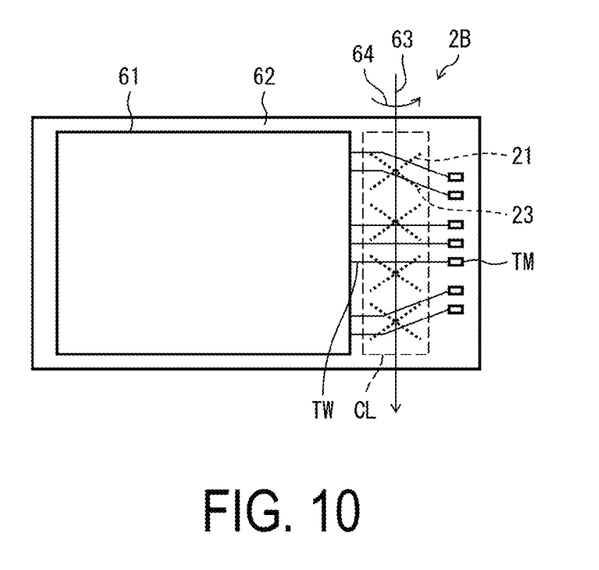
FIG. 10 is a plan view illustrating a configuration of a display device including a resin substrate.

FIG. 10 is a plan view illustrating a configuration of a display device 2B including the resin substrate 1B. The configuration of the display device 2B is basically the same as that of the display device 2. However, the display device 2B and the display device 2 have different long-axis directions 21 and different long-axis directions 23.

In the display device 2B, the long-axis direction 21 of the polymer resin in the first resin layer 11 is slanted with respect to the short-side direction 63 of the display device 2B. Thus, in a case where the bending portion CL is bent along the short-side direction 63 and in the bending direction 64, a crack is less likely to occur in the first resin layer 11. Similarly, since the long-axis direction 23 of polymer resin in the second resin layer 13 is slanted with respect to the short-side direction 63, a crack is also less likely to occur in the second resin layer 13. Thus, a deep crack in the resin substrate 1B is less likely to occur compared with the resin substrate 1 according to the first embodiment. For this reason, the water proof property of the resin substrate 1B is maintained in a more favorable manner, and this makes it possible to further enhance the reliability of the resin substrate 1. In addition, the entry of water into the bending portion CL is further prevented, and thus it is possible to further enhance the reliability of the display device 2 including the bending portion CL.

It is preferable that the long-axis direction 21 is slanted at at least 20° with respect to the long-axis direction 23 in a plan view of the resin substrate 1B. In this case, even if a crack occurs in the first resin layer 11, the crack does not expand to the second resin layer 13 because the long-axis direction 23 of the polymer resin in the second resin layer 13 is sufficiently slanted with respect to the direction in which the crack occurs. Similarly, even if a crack occurs in the second resin layer 13, the crack does not expand to the first resin layer 11 because the long-axis direction 21 of the polymer resin in the first resin layer 11 is sufficiently slanted with respect to the direction in which the crack occurs. In any of the cases, a crack is prevented from having a depth to the extent that the crack penetrates through the resin substrate 1B, and this makes it possible to enhance the reliability of the resin substrate 1.

Supplement

A resin substrate (1) according to one aspect of the disclosure includes: a first resin layer (11) made of a first polymer resin having a first long-axis direction (21); an intermediate layer (12) formed on the first resin layer; and a second resin layer (13) made of a second polymer resin having a second long-axis direction (23) slanted with respect to the first long-axis direction in a plan view, the second resin layer being formed on the intermediate layer.

With the configuration described above, it is possible to further enhance the reliability of a resin substrate.

In the first aspect, the resin substrate according to a second aspect of the disclosure is provided such that the first long-axis direction is slanted at at least 20° with respect to the second long-axis direction.

With the configuration described above, it is possible to prevent a crack from occurring in any of the first resin layer and the second resin layer.

In the second aspect, the resin substrate according to a third aspect of the disclosure is provided such that the second long-axis direction is perpendicular to the first long-axis direction.

With the configuration described above, it is possible to prevent a crack from occurring in any of the first resin layer and the second resin layer more effectively.

In any of the first to third aspects, the resin substrate according to a fourth aspect of the disclosure is provided such that both of the first long-axis direction and the second long-axis direction are slanted with respect to a direction of the same side of the resin substrate.

With the configuration described above, it is possible to further prevent a crack from occurring in the resin substrate in a case where the resin substrate is bent.

In any of the first to fourth aspects, the resin substrate according to a fifth aspect of the disclosure is provided such that both of the first polymer resin and the second polymer resin are polyimide.

In any of the first to fifth aspects, the resin substrate according to a sixth aspect of the disclosure is provided such that the intermediate layer is made of an inorganic material.

A display device (2) according to a seventh aspect of the disclosure includes the resin substrate according to any of the first to fifth aspects.

In the seventh aspect, the display device according to an eighth aspect of the disclosure is provided such that the display device further includes a display region including a plurality of light emitting elements, a frame region surrounding the display region, a terminal portion provided at an end portion of the frame region, a bending portion provided between the terminal portion and the display region, a TFT layer, a pixel circuit formed in the TFT layer and provided in the display region in a matrix shape, a wiring line formed in the TFT layer, the wiring line configured to apply a signal to the pixel circuit, a lead wiring line configured to electrically connect the wiring line and the terminal portion, an inorganic film formed in the TFT layer and provided with an opening at the bending portion, a first flattening film with which the opening is filled, and a second flattening film that interposes the lead wiring line above the opening between the first flattening film and the second flattening film.

In the eighth aspect, the display device according to a ninth aspect of the disclosure is provided such that at least either one of the first flattening film and the second flattening film is made of third polymer resin having a third long-axis direction, the third long-axis direction coinciding with the first long-axis direction and being slanted with respect to the second long-axis direction in a plan view.

The disclosure is not limited to each of the embodiments described above, and various modifications may be implemented within a range not departing from the scope of the claims. Embodiments obtained by appropriately combining technical approaches stated in each of the different embodiments also fall within the scope of the technology of the disclosure. Novel technical features may be formed by combining the technical approaches disclosed in each of the embodiments.

REFERENCE SIGNS LIST 1, 1B Resin substrate
2, 2B Display device
11 First resin layer
12 Intermediate layer
13 Second resin layer
14 Base coat
21, 23 Long-axis direction
41 Glass substrate
51, 52 Application direction
61 Display region
62 Terminal portion
TM Frame region
CL Bending portion

The invention claimed is:

1. A display device comprising a resin substrate comprising:
   a first resin layer made of a first polymer resin having a first long-axis direction;
   an intermediate layer formed on the first resin layer; and
   a second resin layer made of a second polymer resin having a second long-axis direction slanted with respect to the first long-axis direction in a plan view, the second resin layer being formed on the intermediate layer,
   wherein the display device further includes
   a display region including a plurality of light emitting elements,
   a frame region surrounding the display region,
   a terminal portion provided at an end portion of the frame region,
   a bending portion provided between the terminal portion and the display region,
   a TFT layer,
   a pixel circuit formed in the TFT layer and provided in the display region in a matrix shape,
   a wiring line formed in the TFT layer, the wiring line configured to apply a signal to the pixel circuit,
   a lead wiring line configured to electrically connect the wiring line and the terminal portion,
   an inorganic film formed in the TFT layer and provided with an opening at the bending portion,
   a first flattening film with which the opening is filled, and
   a second flattening film that interposes the lead wiring line above the opening between the first flattening film and the second flattening film, and
   wherein at least either one of the first flattening film or the second flattening film is made of a third polymer resin having a third long-axis direction, the third long-axis direction coinciding with the first long-axis direction and being slanted with respect to the second long-axis direction in a plan view.

2. The display device according to claim 1, wherein the first long-axis direction is slanted at least 20° with respect to the second long-axis direction.

3. The display device according to claim 2, wherein the second long-axis direction is perpendicular to the first long-axis direction.

4. The display device according to claim 1, wherein both the first long-axis direction and the second long-axis direction are slanted with respect to a direction of the same side of the resin substrate.

5. The display device according to claim 1, wherein both the first polymer resin and the second polymer resin are a polyimide.

6. The display device according to claim 1, wherein the intermediate layer is made of an inorganic material.

* * * * *